United States Patent [19]

Kunze-Concewitz et al.

[11] Patent Number: 5,069,155
[45] Date of Patent: Dec. 3, 1991

[54] APPARATUS FOR IN-LINE LACQUERING OF COMPACT DISKS

[75] Inventors: Horst Kunze-Concewitz, Wiernsheim; Roland Zaiss, Niefern, both of Fed. Rep. of Germany

[73] Assignee: Convac GmbH, Fed. Rep. of Germany

[21] Appl. No.: 358,355
[22] PCT Filed: Sep. 22, 1988
[86] PCT No.: PCT/EP88/00858
 § 371 Date: May 23, 1989
 § 102(e) Date: May 23, 1989
[87] PCT Pub. No.: WO89/02819
 PCT Pub. Date: Apr. 6, 1989

[30] Foreign Application Priority Data

Sep. 24, 1987 [DE] Fed. Rep. of Germany ....... 3732113

[51] Int. Cl.$^5$ .................. B05C 1/02; B05C 5/00
[52] U.S. Cl. ............................ 118/52; 118/503
[58] Field of Search .............. 118/52, 56, 500, 501, 118/503, 320, 321, 730, 52

[56] References Cited
U.S. PATENT DOCUMENTS

| 3,645,581 | 2/1972 | Lasch et al. ........................ 118/52 |
| 4,315,705 | 2/1982 | Flint ..................................... 118/52 |
| 4,447,468 | 5/1984 | Keable ................................ 118/703 |
| 4,457,259 | 7/1984 | Samuels .............................. 118/52 |
| 4,519,767 | 5/1985 | Westerman ....................... 425/810 |
| 4,838,979 | 6/1989 | Nishida et al. ..................... 118/320 |

Primary Examiner—Willard Hoag
Attorney, Agent, or Firm—Jones, Tullar & Cooper

[57] ABSTRACT

An apparatus for in-line lacquering of compact disks, having a processing apparatus for the metered application of a lacquer bead to one surface of the compact disk and for uniformly distributing the lacquer bead over the surface of the compact disc by means of centrifugal force, and having a manipulator for delivering and removing the compact disks to and from the processing apparatus. To enable such an apparatus to operate faster, with unchanged quality of the lacquering, it is provided that the processing apparatus has a lacquer metering station and spaced apart from it a lacquer bead centrifuging station; that a loading station is disposed spaced apart from the lacquer metering station and an unloading station is disposed spaced apart by the same distance from the lacquer bead centrifuging station; and that the manipulator has three parallel grippers which are driven in common, movable in harmonic fashion, between two adjacent stations.

11 Claims, 1 Drawing Sheet

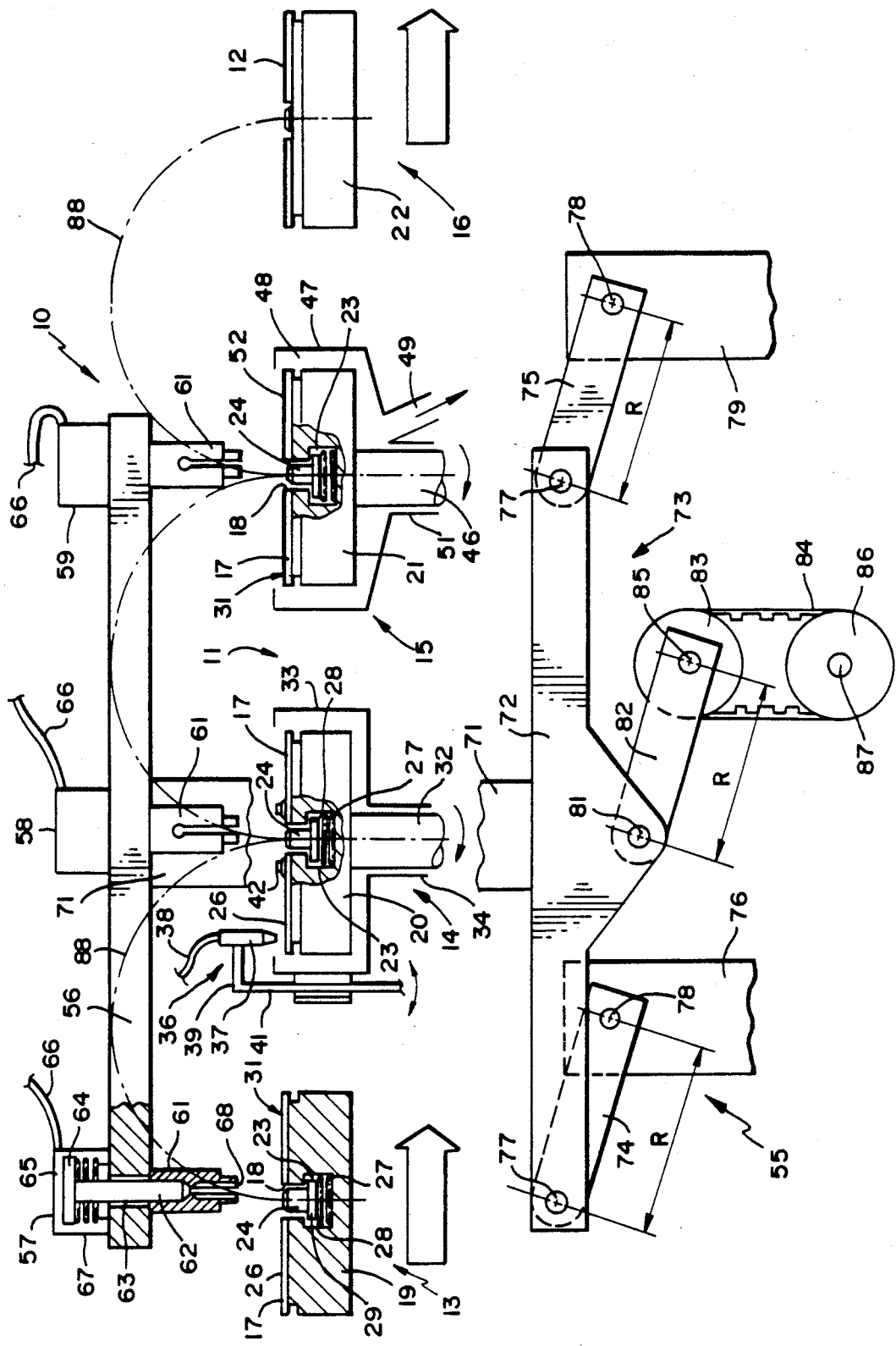

5,069,155

APPARATUS FOR IN-LINE LACQUERING OF COMPACT DISKS

BACKGROUND OF THE INVENTION

1. Field of the Invention

The present invention relates to an apparatus for in-line lacquering of compact disks as generically defined by the preamble to claim 1.

2. Prior Art

In the manufacture of compact disks or CDs, the following manufacturing steps are performed: pressing of the disk blanks of the CDs, vapor-depositing of an aluminum layer on one side of the disk, lacquering of the side of the disk having the aluminum layer, printing of this side of the disk, and packaging in slip cases.

Known apparatuses for in-line lacquering of compact disks, which are disposed in a production line of the kind in which the individual devices are adapted to one another in terms of capacity, have a single station in the processing apparatus in which the disk, having been provided with the aluminum layer, is initially provided with a lacquer bead, which subsequently is uniformly distributed over the surface of this side of the disk by centrifuging Since in this kind of production line the lacquering process, including loading and unloading, takes several times as much time as that required for pressing and in particular for the aluminum vapor deposition, such a production line has heretofore been provided with a plurality of parallel lacquering devices, e.g., five in number, which operate either continuously, directly following the aluminum vapor deposition apparatus, or via intermediate magazines.

SUMMARY OF THE INVENTION

It is therefore the object of the present invention to provide an apparatus for in-line lacquering of compact disks of the above-defined type which operates faster, without any loss in the lacquering quality.

For attaining this object, in an apparatus for in-line lacquering of compact disks, a processing apparatus is provided having a lacquer metering station, a lacquer bead centrifuging station spaced apart from the lacquer metering station, a loading station associated with the lacquer metering station, an unloading station associated with the lacquer bead centrifuging station, each station spaced apart by the same distance, and a manipulator, having preferably three parallel grippers which are driven in common to move in harmonic fashion between two adjacent station.

Because the processing apparatus is divided into two stations, and because of the integrated manipulation apparatus, a major time savings of approximately one-half the previous processing time is attainable. This means that the number of parallel-operating lacquering devices required can be reduced by half. It also means that less space is required and the capital investment is lower. A very substantial feature is that because of the harmonic course of motion of the manipulation apparatus, it is assured that the lacquer bead applied in the lacquer metering station does not run off on one side, so that the previously attained quality of uniform lacquer application to the surfaces of the disk remains unchanged, since impact-free, nonbucking acceleration or deceleration of the manipulation apparatus in the horizontal plane is attained.

With a lacquering metering station provided with a turntable for centeringly receiving the compact disk, a lacquer supply device pivotable above the compact disk, the lacquer bead centrifuging station provided with a turntable for the centering reception of the compact disk, with a splash protector surrounding the turntable, and a lacquer collecting device, the loading station having a delivery tray for the centering reception of the compact disk, and the unloading station having a delivery tray, the respective station is capable of receiving and processing or manipulating the applicable compact disk more quickly and simply.

By means of the leverlike parallel mechanism of the grippers of the manipulator, which moves back and forth and with which the parallel grippers are connected for interlocked motion, an advantageous and structurally simple embodiment of the manipulation apparatus is disclosed, for executing the course of the aforementioned harmonic motion. The same is true for the further embodiments according to which the parallel mechanism has parallel cranks which at one end are pivotably supported in stationary fashion and at the other end are pivotably connected to a coupling rod, which rigidly supports the parallel grippers, and according to which a crank engages the coupling rod, which crank is connected in a manner fixed against relative rotation to a toothed belt drive driven such as to be movable back and forth such that the parallel crank mechanism is substantially play-free and elastic.

With the gripper being provided with a clamping mandrel which cooperates with a centering mandrel in the respective delivery tray or turntable of the applicable station upon the setting down or receiving of a compact disk a rapid and simple transfer or takeover of the CD blank between the manipulation apparatus and the respective station is attainable. The characteristics of claim 10 may suitably be provided in this respect.

BRIEF DESCRIPTION OF THE DRAWING

Further details of the invention can be found in the ensuing description, in which the invention is described and explained in further detail in terms of the exemplary embodiment shown in the drawing.

In a schematic, partly cutaway side view, the single drawing FIGURE shows an apparatus for in-line lacquering of compact disks in accordance with a preferred exemplary embodiment of the present invention.

DETAILED DESCRIPTION OF THE PREFERRED EMBODIMENTS

A lacquering apparatus 10 of compact disks 12 (or CDs) is disposed, in a manner not shown here, in a production line for manufacturing such compact disks 12. The lacquering apparatus 10 has a loading station 13; a processing apparatus 11 with a lacquer metering station 14 and a lacquer bead centrifuging station 15; and an unloading station 16. The stations 13–16 are disposed at uniform intervals from one another and are all at the same height.

In order for a disk blank 17 of a compact disk 12, which is provided with a central hole 18, to be received in a centered manner, at least the stations 13, 14 and 15, and optionally the unloading station 16 as well, have a centering mandrel 24, in a central receiving opening 23 on a receiving tray 19, 20, 21 and 22, respectively. In its centering position, the centering mandrel 24, protrudes beyond the surface 26 of the applicable receiving tray 19-22 and is capable of penetrating the hole 18 in the disk blank 17. To release this centering, as will be described hereinafter, the centering mandrel 24 may be forced into the receiving opening 23. To this end, the centering mandrel 24 is movable in the axial direction counter to the action of a compression spring 27, which is supported at one end on the bottom of the receiving opening 23 and at the other end in the rear or inner end of the centering mandrel 24. In its centering position, the centering mandrel 24 rests with an annular collar 28 on a shoulder 29 of the receiving opening 23.

The receiving tray 19 of the loading station 13 is disposed in a stationary fashion. An apparatus preceding it, not shown, for the vapor deposition of an aluminum layer onto a surface 31 of the disk blank 17 of the compact disk 12 to be manufactured supplies the loading station 13 with a corresponding coated disk blank 17.

The receiving tray 20 of the lacquer metering station 14 is drivable in rotation at approximately 200 rpm via a concentric shaft 32. This receiving tray 20, embodied as a turntable, is surrounded by a cup-shaped shield 33, the holder 34 of which, disposed on the bottom, forms a bearing sleeve for the drive shaft 32. A lacquer supply device 36 is provided at a circumferential region of the lacquer metering station 14 and is pivotable above the receiving tray 20 and out of the vicinity of the path of supply to and removal from the receiving tray 20. The lacquer supply device 36 has a nozzle 37, which is supplied with lacquer in a metered fashion via a supply line 38 the lacquer supply device 36 is connected to a pivot shaft by nozzle arm 39, and extends vertically, disposed on the outside of the cup-shaped shield 33. The nozzle arm 39 is approximately long enough that in the inwardly pivoted state the nozzle 37 is disposed near the center of the receiving tray 20, or near the hole 18 in the disk blank 17 of the compact disk 12 to be manufactured. In this supply position, with the receiving tray 20 driven, lacquer is supplied in metered fashion by means of the nozzle 37, so that a circular lacquer bead 42 forms centrally around the hole 18 on the surface 31 of the disk blank 17.

The receiving tray 21 of the centrifuging station 15 is likewise drivable in rotation via a concentric shaft 46; however, substantially higher speeds, on the order of approximately 2000 to 5000 rpm, are attainable. The receiving tray 21, embodied as a turntable, is surrounded by a cup-shaped splash protector device 47, between the inner wall of which and the outer circumference of the receiving tray 21 a receiving chamber 48 is provided, which is provided at a circumferential region of the bottom of the cup-shaped splash protector 47 with a drainage line 49, by way of which the excess lacquer is aspirated or removed for re-use. Because of the high rpm, the lacquer bead 42 is distributed uniformly over the surface 31 of the disk blank 17 by centrifugal force; the excess lacquer being collected by the cup-shaped splash protector 47. Once again, a cylindrical holder 51 of the cup-shaped splash protector 47 is provided, for holding the driven shaft 46 in a supported manner.

The receiving tray 22 of the unloading station 16, like the loading station 13, is disposed in a stationary fashion. From the unloading station 16, the disk blank 17, provided with the uniform layer of lacquer 52 on its surface 31, is passed on to the next station, not shown, for printing of the disk blank 17 and final finishing of the compact disk 12.

The lacquering apparatus 11 also has a manipulator 55, with which, via a harmonic course of motion and in parallel, an aluminum-coated disk blank 17 is moved from the loading station 13 to the lacquer metering station 14, while, simultaneously, a disk blank 17 provided with the lacquer bead 42 is moved from the lacquer metering station 14 to the centrifuging station 15, and a disk blank 17 provided with the lacquer layer 52 is moved from the centrifuging station 15 to the unloading station 16. This manipulator 55 has a spar 56 on which three grippers 57, 58, 59 are arranged, spaced apart by the same distance as the individual stations 13–16. The grippers 57–59 are identical, so that hereinafter only one of these grippers will need to be described. The gripper 57 has a clamping mandrel 61 protruding vertically from the underside of the spar 56, which mandrel can be spread apart by a pin 62. The pin 62 penetrates a bore 63 in the spar 56 and in the vicinity of the top of the spar 56 is firmly connected to a piston 64, which is movable in the axial direction inside a cylinder 65 secured to the spar 56. To this end, the cylinder 65 is connected at one end to a line 66, e.g. a pneumatic line, and the piston 64 is supported via a compression spring 67 on the top of the spar 56. This means that when compressed air acts upon the spar 64, the spreader pin 62 moves downward, and spreads apart the clamping mandrel 61, which has an interior restriction and is slit. At its free end, the clamping mandrel 61 has an annular end face 68, which is capable of being operatively connected to the centering mandrel 24 in a manner to be described hereinafter.

The spar 56 is connected approximately in the middle with a vertically offstanding beam 71, the other end of which is firmly connected to a coupling rod 72 of a parallel crank mechanism 73. The coupling rod 72 extends parallel to the spar 56 and is pivotably connected at both ends, via a respective shaft 77, with a respective crank 74, 75. The crank 74 and 75 are pivotably held on their end remote from the coupling rod 72 on stationary bearings 76 and 79 by means of shafts 78. In the vicinity of the fastening of the beam 71 to the coupling rod 72, a third crank 82 engages a shaft 81, which with the two lateral shafts 77 forms a triangle; at its other end, the third crank 82 is connected via a shaft 85 to a toothed belt pulley 83 in a manner fixed against relative rotation. This first toothed belt pulley 83 is coupled via a toothed belt 84 to a second toothed belt pulley 86, the shaft 87 of which is rotatably drivable back and forth as indicated by the double arrow A in a manner not shown. With the parallel crank mechanism 73, the distances between the shafts 77, 81 and the associated shafts 78, 85 are in each case equal.

With the drive of the pinion toothed belt drive 83–87, the coupling rod 72 and with it the spar 56 having the grippers 57–59 move along a half-wave of a harmonic path 88, which enables an impact-free and nonbucking acceleration and deceleration in a horizontal plane. In the position of the parallel crank mechanism 73 shown in the single drawing FIGURE, a readiness position is attained, for instance close to one end of the path of motion 88 indicated by dot-dash lines. At one or the other end of the path of motion 88, a plunging of the clamping mandrel 61 into the receiving opening 23 of the applicable receiving tray 19–22 takes place, which has the effect that the centering mandrel 24 is forced, counter to the action of the compression spring 27, into the receiving opening 23, so that the clamping mandrel 61 penetrates the hole 18 of the disk blank 17 of the compact disk 12 to be manufactured. In this position at the end of the path of motion, the disk blank 17 is either released by unclamping the clamping mandrel 61 and placed on the applicable receiving tray 19-22, or a disk blank 17 that has been set down is grasped by the clamping mandrel 61, by the motion of the clamping pin 62 into its clamping position, and carried along with the mandrel 61. It should also be noted in this respect that all the receiving trays 19-22 are located in a horizontal plane.

The process of lacquering in the lacquering apparatus 11 proceeds as follows, on the precondition that a disk blank 17 that has been provided on its surface 31 with a vapor-deposited aluminum layer has been placed in the loading station 13; that a disk blank 17 that has just been provided with a lacquer bead 42 on its surface 31 has been placed in the lacquer metering station 14, that a disk blank 17 that has just been provided on its surface 31 with a lacquer layer 52 has been received in the centrifuging station 15, and that a disk blank 17 provided with the dried lacquer layer 52 has been received in the unloading station 16. The grippers 57-59 are relaxed and therefore are not holding any disk blank 17. With the aid of the parallel crank mechanism 73, as seen in the drawing, the empty grippers 57-59 are moved out of their readiness positions to stations 13-15, whereupon the clamping mandrels 61 plunge into the respective receiving trays 19-21 and force the centering mandrels 24 back. Via the pneumatic line 66, the pistons 64 are triggered so that the clamping mandrels 61 penetrating the respective disk blanks 17 are tightened and hold the disk blank 17. Thereupon, the parallel crank mechanism 73 is moved along the harmonic path of motion 88 from the terminal position on the left to the terminal position on the right, in the course of which the disk blanks 17 are carried along by each gripper 57-59 and set down in the respective adjacent station 14-16 at the end of the motion, with the lacquer supply device 36 having been pivoted beforehand out of the path of motion 88 of the disk blank 17 and the unloading station 16 having been unloaded. With this setting down of the disk, the clamping mandrels 61 penetrate the respective receiving trays 20-22 and set the disk blanks 17 down on the respective receiving trays 20-22 in a centering manner. After that, the clamping mandrels 61 are relaxed by bleeding the pneumatic lines 66, so that the grippers 57-59, in their return motion, let go of the disk blanks 17. Since with the retraction of the clamping mandrels 61 the centering mandrels 24 penetrate the holes 31 of the disk blanks 17, the centering of the disk blanks 17 on the receiving trays 20-22 is maintained. During the return motion of the grippers 57-59, the loading station 13 is supplied with a new disk blank 17 by the aluminum vapor-deposition apparatus, the lacquer supply device 36 is pivoted into place in the lacquer metering station 14, the receiving tray 20 is driven to rotate and provided via the nozzle 37 with a lacquer bead 42, the receiving tray 21 in the centrifuging station 15 is driven to rotate, and the lacquer of the bead 42 is distributed uniformly over the surface 31 of the disk blank 17, and the disk blank 17, now provided with the dried lacquer layer 52, is passed on by the unloading station 16 to the printing apparatus. As soon as the grippers 57-59 have arrived at their starting position, the above-described procedure begins anew.

It will be understood that instead of the toothed belt drive for the parallel crank mechanism 73, a drive comprising a pinion plus a toothed quadrant, which engages the coupling rod 72, or a drive comprising gears plus a crank, or a direct drive at a crank, may be used.

We claim:

1. An apparatus for the in-line lacquering of compact disks, comprising:

a process apparatus including a loading means at which a compact disk is received and centered, a lacquer metering means at which a compact disk is received from the loading means and centered and a lacquer bead applied to the top surface of the compact disk, a lacquer bead centrifuging means at which the compact disk with a lacquer bead is received from the lacquer metering means, centered and rotated, and the lacquer bead uniformly distributed over the top surface of the compact disk by centrifugal force, an unloading means at which a compact disk is received from the lacquer bead centrifuging means and centered for rotating the compact disk at least the lacquer bead, wherein said means are spaced apart by the same distance; and a manipulator including at least one gripper for moving compact disks in harmonic fashion between adjacent ones of said loading means, lacquer metering means, lacquer bead centrifuging means and unloading means.

2. The apparatus as defined in claim 1, wherein said manipulator includes three grippers.

3. The apparatus as defined in claim 1, wherein the lacquer metering means includes a turntable for receiving and centering the compact disk and a lacquer supply device pivotably mounted above the compact disk.

4. The apparatus as defined in claim 1, wherein the lacquer bead centrifuging means includes a turntable for receiving and centering the compact disk, a splash protector surrounding the turntable and a lacquer collecting device.

5. The apparatus as defined in claim 1, wherein the loading means includes a receiving tray for receiving and centering the compact disk.

6. The apparatus as defined in claim 1, wherein the unloading means includes a receiving tray for receiving and centering the compact disk.

7. The apparatus as defined in claim 1, wherein said manipulator further includes a crank mechanism interlocked with the at least one gripper, said crank mechanism being movable back and forth in direction parallel to said loading means, lacquer metering means, lacquer bead centrifuging means and unloading means to impart said back and forth motion to the at least one gripper.

8. The apparatus as defined in claim 7, wherein said crank mechanism includes a coupling rod and spaced apart parallel cranks pivotably supported in stationary fashion at one end and at their other end pivotably connected to said coupling rod, said coupling rod being rigidly connected to the at least one gripper.

9. The apparatus as defined in claim 8, wherein said crank mechanism further includes a toothed belt drive, and wherein one of said cranks is fixedly connected against relative rotation to said toothed belt drive so as to be movable back and forth.

10. The apparatus as defined in claim 2, wherein each of said grippers includes a clamping mandrel, and wherein each of said loading means, lacquer metering means, lacquer bead centrifuging means and unloading means includes a centering mandrel, said clamping mandrels cooperating with a respective centering mandrel of one of said loading means, lacquer metering means, lacquer bead centrifuging means and unloading means.

11. The apparatus as defined in claim 10, wherein each of said loading means, lacquer metering means, lacquer bead centrifuging means and unloading means includes means for resiliently supporting its centering mandrel in the axial direction.

* * * * *